United States Patent
Luan et al.

(10) Patent No.: US 9,930,794 B2
(45) Date of Patent: Mar. 27, 2018

(54) FLEXIBLE APPARATUS AND ELECTRONIC DEVICE

(71) Applicant: Lenovo (Beijing) Limited, Beijing (CN)

(72) Inventors: Beiou Luan, Beijing (CN); Changlong Zuo, Beijing (CN)

(73) Assignee: Lenova (Beijing) Limited, Beijing (CN)

( * ) Notice: Subject to any disclaimer, the term of this patent is extended or adjusted under 35 U.S.C. 154(b) by 0 days.

(21) Appl. No.: 15/389,875

(22) Filed: Dec. 23, 2016

(65) Prior Publication Data

US 2017/0188474 A1 Jun. 29, 2017

(30) Foreign Application Priority Data

Dec. 25, 2015 (CN) .......................... 2015 1 0996711

(51) Int. Cl.
*H05K 5/02* (2006.01)
*H05K 5/00* (2006.01)
*H05K 7/14* (2006.01)
*G06F 1/16* (2006.01)
*G09F 9/30* (2006.01)

(52) U.S. Cl.
CPC .......... *H05K 5/0217* (2013.01); *G06F 1/1652* (2013.01); *G09F 9/301* (2013.01); *H05K 5/0017* (2013.01); *H05K 7/14* (2013.01)

(58) Field of Classification Search
CPC combination set(s) only.
See application file for complete search history.

(56) References Cited

U.S. PATENT DOCUMENTS

| 8,971,032 | B2 * | 3/2015 | Griffin | G06F 1/1652 345/156 |
|---|---|---|---|---|
| 9,013,864 | B2 * | 4/2015 | Griffin | H04M 1/0216 16/382 |
| 9,047,055 | B2 * | 6/2015 | Song | E05D 3/14 |
| 9,173,287 | B1 * | 10/2015 | Kim | H05K 1/028 |
| 9,179,559 | B1 * | 11/2015 | Kim | G06F 1/1616 |
| 9,348,370 | B2 * | 5/2016 | Song | G06F 1/1681 |
| 9,562,380 | B2 * | 2/2017 | Song | G06F 1/16 |
| 9,606,384 | B2 * | 3/2017 | Kim | G02F 1/133308 |
| 9,615,473 | B2 * | 4/2017 | Kim | G06F 1/1652 |
| 2016/0139634 | A1 * | 5/2016 | Cho | G06F 1/1652 361/679.27 |

(Continued)

*Primary Examiner* — Lisa Lea Edmonds
(74) *Attorney, Agent, or Firm* — Kunzler, PC

(57) ABSTRACT

An apparatus to support a flexible screen of an electronic device includes a plurality of shafts, a plurality of rows of first connecting members, and a plurality of rows of second connecting members. Each first and second connecting member has a top side, a bottom side, a left aperture and a right aperture extending from the top side to the bottom side, with each aperture coupled to a shaft. The width of the apertures for each second connecting member is greater than the width of the apertures for each first connecting member. The plurality of shafts are connected to each other by alternate rows of first connecting members and second connecting members along the length of the shafts. Each connecting member in a row of connecting members overlaps with two connecting members in an adjacent row of connecting members.

20 Claims, 6 Drawing Sheets

(56) References Cited

U.S. PATENT DOCUMENTS

| | | | |
|---|---|---|---|
| 2016/0187935 A1* | 6/2016 | Tazbaz | G06F 1/1681 361/679.03 |
| 2016/0198579 A1* | 7/2016 | Hong | F16M 13/00 248/346.01 |
| 2016/0239046 A1* | 8/2016 | Park | G06F 1/163 |
| 2017/0023987 A1* | 1/2017 | Wang | G06F 1/1681 |
| 2017/0061836 A1* | 3/2017 | Kim | G09F 9/301 |
| 2017/0094775 A1* | 3/2017 | Fan | G06F 1/1652 |
| 2017/0192460 A1* | 7/2017 | Watanabe | G06F 1/1652 |

\* cited by examiner

FLEXIBLE APPARATUS AND ELECTRONIC DEVICE

FIELD

The subject matter disclosed herein relates to a mechanical apparatus, and, more specifically, to a flexible apparatus used in conjunction with an electronic device.

BACKGROUND

As society develops, flexible electronic devices are becoming ever more widely used in people's lives and production.

Flexible electronic devices comprise a flexible screen and a flexible apparatus disposed in an overlapping arrangement (e.g., on opposite sides), with the flexible apparatus being part of a housing or casing used to support the flexible screen. Flexible apparatuses may comprise a plurality of sequentially connected connection joints and/or an elastic material, but the length of the flexible apparatus remains largely unchanged. When an electronic device having a flexible apparatus is in a bent state with the flexible screen facing inward, an area of the flexible apparatus covering the flexible screen is largely fixed, which can cause the ends of the flexible screen and the flexible apparatus to become misaligned. This can easily result in the ends of the flexible screen being compressed and damaged by the casing of the electronic device, thus affecting the service life of the electronic device.

Additionally, often in the electronic devices, the ends of the flexible screen and ends of the flexible apparatus are fixed together. In this situation, when the electronic device is in a bent state with the flexible screen facing inward, the flexible screen can be compressed by the flexible apparatus and is prone to wrinkles (i.e., creases), which affects both user's viewing experience of the flexible screen, and also has an influence on the service life of the flexible screen.

In summary, the technical problem urgently needing to be solved by those skilled in the art is how to provide a flexible apparatus whose length is increased while bending to prevent the flexible screen from being damaged by the case of the electronic device when the flexible apparatus is in the bent state and the flexible screen is located on the inner side of the flexible apparatus.

SUMMARY

In view of the problem described above, the present subject matter discloses a flexible apparatus for supporting a flexible screen of an electronic device. The apparatus includes a plurality of shafts, a plurality of rows of first connecting members, and a plurality of rows of second connecting members. Each first and second connecting member has a top side, a bottom side, a left aperture and a right aperture extending from the top side to the bottom side, with each aperture coupled to a shaft. The width of the apertures for each second connecting member is greater than the width of the apertures for each first connecting member. The plurality of shafts are connected to each other by alternate rows of first connecting members and second connecting members along the length of the shafts. Each connecting member in a row of connecting members overlaps with two connecting members in an adjacent row of connecting members.

In one embodiment, the left aperture and the right aperture of each second connecting member have an arc shape and the shaft coupled to each aperture can move along the curve of the arc, thus allowing the flexible apparatus to lengthen.

In an embodiment, the apparatus also includes an elastic clamp member that runs serially through a row of second connecting members. In this embodiment, each connecting member of the row of second connecting members also have a horizontal aperture on its bottom side, and each connecting member of a row of first connecting members adjacent to the row of second connecting members further comprises a horizontal groove on its top side. The elastic clamp member slots into the horizontal groove to stabilize or hold the flexible apparatus in its flat state.

In another embodiment, the apparatus also includes a damping member to help the flexible apparatus maintain its shape. Sometimes, a damping member can be one or more elastic sheets sandwiched between the alternate rows of first connecting members and second connecting members. Other times, the damping member is a friction pad fixed on the inner wall of the left and right apertures of a second connecting member.

In some embodiments, the apparatus also includes a first mounting block and a second mounting block. The first mounting block and second mounting block each include a connecting block, each connecting block connecting to the same end of the alternate rows of first connecting members and second connecting members.

In still other embodiments, the apparatus also includes a lining plate whose ends are attached to the first mounting block and the second mounting block.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

The present disclosure pertains to a flexible apparatus, whose length increases when the flexible apparatus is transformed from a flat state into a bent state and decreases when the flexible apparatus is transformed from a bent state into a flat state. The ends of the flexible apparatus may remain aligned with the ends of the flexible screen of the electronic device to avoid damage to the flexible screen, thereby improving the service life. An electronic device may adopt the above flexible apparatus to avoid the damage to the flexible screen.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

Figure 1:
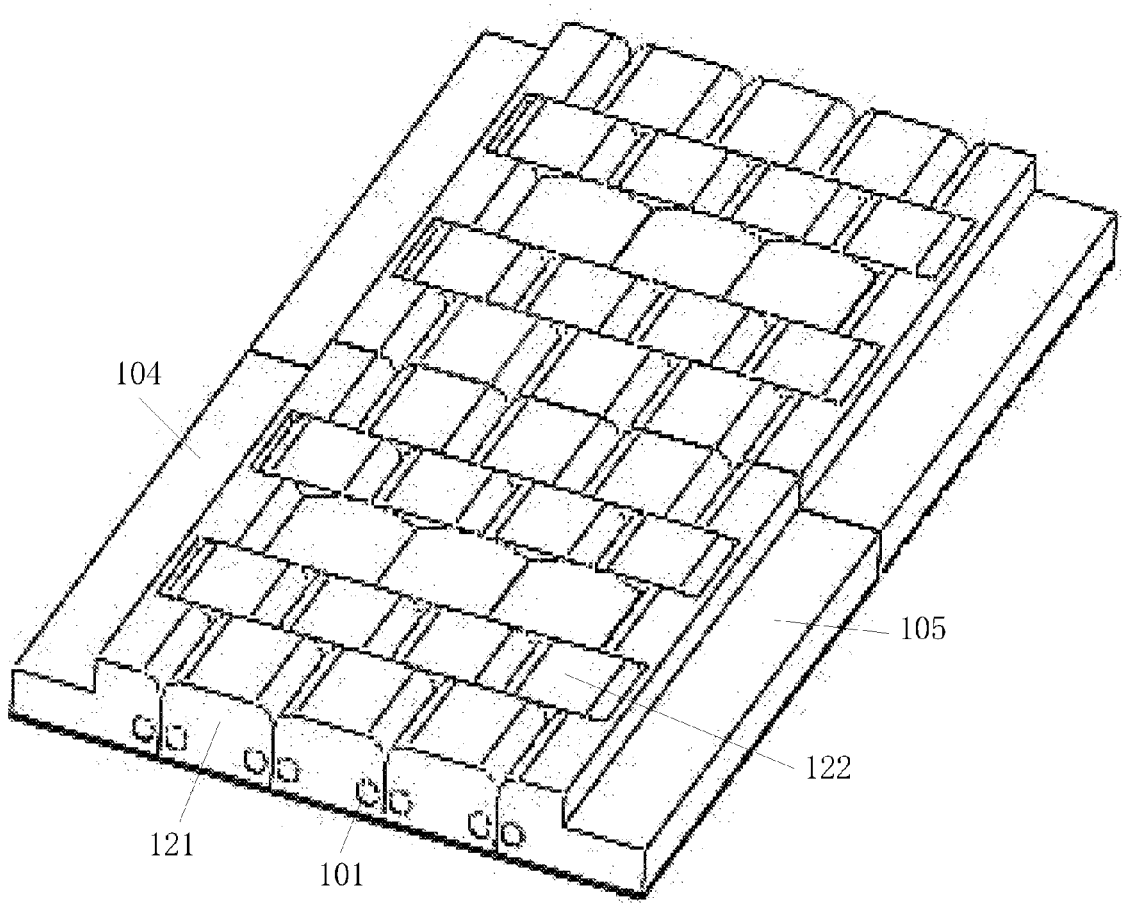
FIG. 1 is a schematic diagram illustrating a flexible apparatus in a flat state according to an embodiment.
Figure 2:
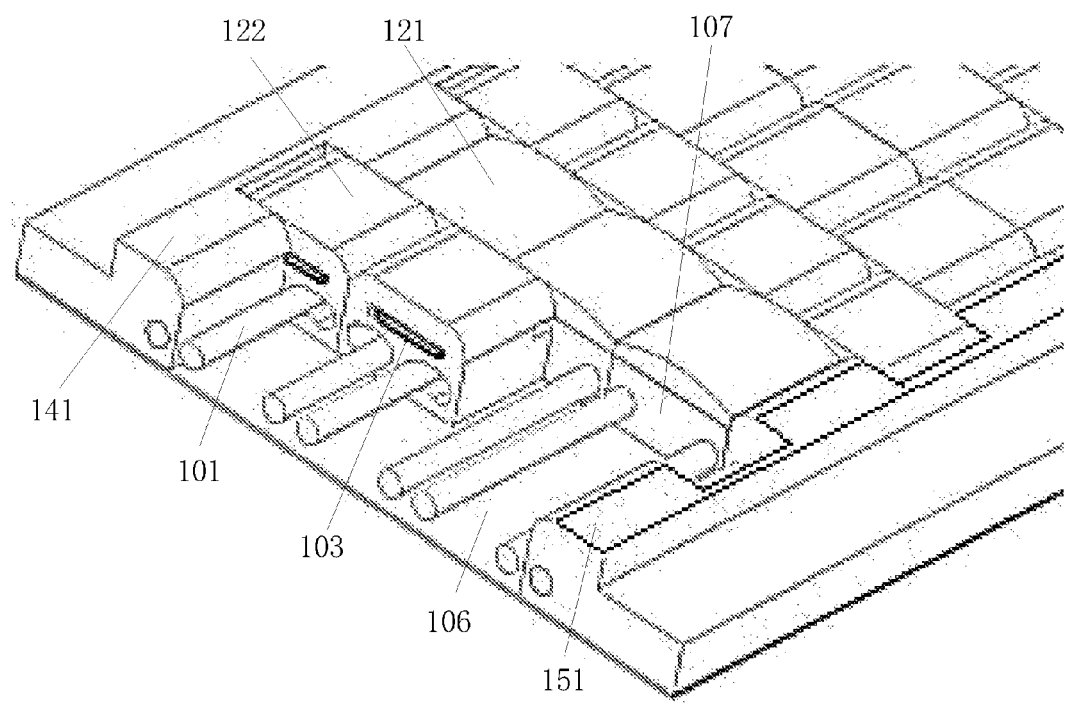
FIG. 2 is an internal schematic diagram of the flexible apparatus as shown in FIG. 1.
Figure 4:
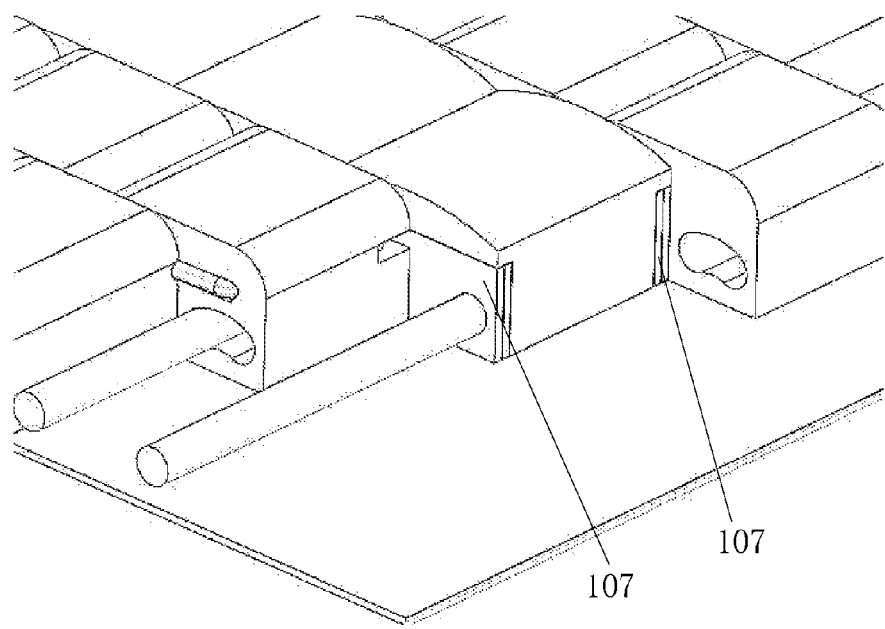
FIG. 4 is still another internal schematic diagram of the flexible apparatus as shown in FIG. 1.
Figure 5:
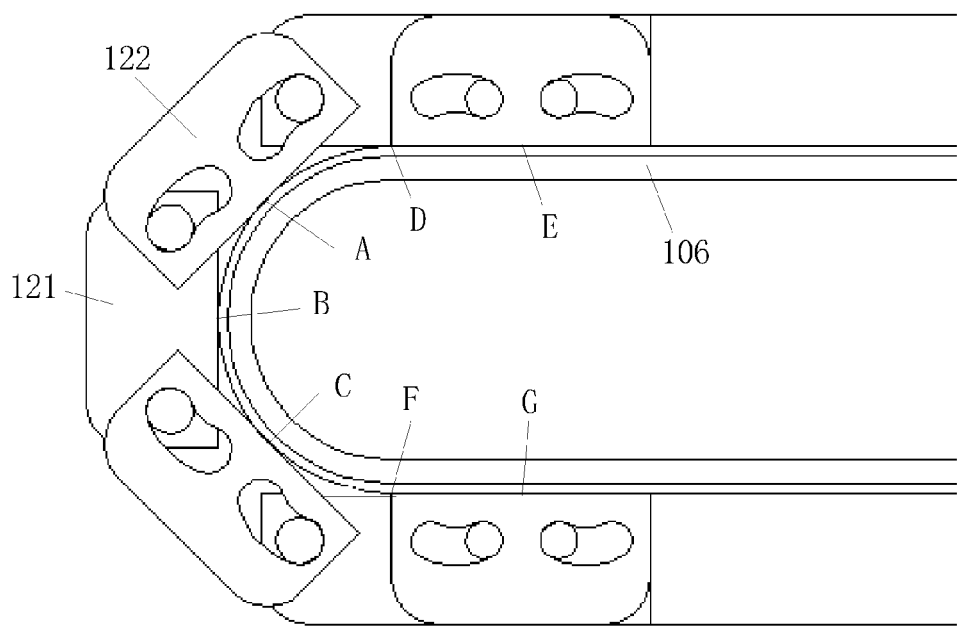
FIG. 5 is a schematic diagram of the flexible apparatus as shown in FIG. 1 in a bent state.

FIG. 1 is a schematic diagram illustrating a flexible apparatus in a flat state. The flexible apparatus comprises a set of elongated shafts 101, a plurality of first connecting members 121, a plurality of second connecting members 122, a first mounting block 104, and a second mounting block 105. The plurality of elongated shafts 101 are arranged in rows, wherein the axes of the shafts 101 are parallel to each other. A connecting member has a top side, a bottom side, and two openings or apertures extending from the top side to the bottom side. The two apertures are located on the left half and the right half of the connecting member. A shaft 101 can be coupled with an aperture by inserting the shaft 101 through the aperture from the top side to the bottom side of the connecting member. In one embodiment, a shaft 101 fits snugly within the apertures of a first connecting member 121. The left and right apertures of a second connecting member 122 are substantially larger than the size of a shaft 101, being wider than the apertures of a first connecting member 121. In one embodiment, the left and right apertures of a second connecting member 122 have a curvilinear shape with two ends, as shown in FIGS. 2, 4, and 5, and which are described further below. In this embodiment, a shaft 101 coupled to the left and right apertures of a second connecting member 122 can move along the arc from one end to the other.

The plurality of shafts 101 are connected by alternating rows of the first connecting members 121 and the second connecting members 122 along the length of the shafts 101. When a shaft 101 is inserted into an aperture (i.e., left or right) of a first connecting member 121 in a row of first connecting members, it is also inserted into the same aperture (i.e., left or right) of another first connecting member 121 in another row of first connecting members. But the same shaft 101 inserted into an aperture (i.e., left or right) of a first connecting member 121 is inserted into the opposite aperture of a second connecting member 122 in a row of second connecting members. For example, a shaft inserted into the left opening of a first connecting member 121 is inserted into the right opening of a second connecting member 122, and vice versa. In this example, except for the connecting members at each end of a row of connecting members, each of the other connecting members in a row of connecting members overlaps with two connecting members in an adjacent row of connecting members (see FIGS. 1 and 7).

The flexible apparatus has a flat state and a bent state. The length of the flexible apparatus increases when the flexible apparatus is switched from the flat state into the bent state, while the length of the flexible apparatus is reduced when the flexible apparatus is switched from the bent state into the flat state. The length of the flexible apparatus refers to the length of a neutral layer, the neutral layer being sandwiched between the inner side and outer side of the flexible apparatus when the flexible apparatus is in the bent state. In addition, the shafts 101 of the shaft group are sequentially arranged along the rectilinear direction when the flexible apparatus is in the flat state; the shafts 101 of the shaft group are sequentially arranged along the curvilinear direction when the flexible apparatus is in the bent state.

The length of the flexible apparatus in this embodiment changes in the process of switching states, enabling the ends of the flexible apparatus to be flush with the ends of the flexible screen during the process of switching the electronic device from the flat state into the bent state, in which the flexible screen is located on the inner side, so as to avoid damage to the flexible screen, thereby improving the service life of the flexible screen.

Additionally, the length of the flexible apparatus in this embodiment changes in the process of switching states, which can both realize that it is always kept attached to the same position on the flexible screen, and can avoid compressing the flexible screen, so as to avoid the wrinkles of the flexible screen in the bent state, thereby facilitating a better viewing experience of the flexible screen for the user, and improving the service life of the flexible screen.

In order to facilitate convenient use, the flexible apparatus provided by the above embodiment is arranged to be able to remain in the flat state, and be able to remain in the bent state to avoid the users having to hold by hand or arrange the additional components to support the flexible apparatus, so that the users can operate the flexible screen and other electronic components supported by the flexible apparatus. It will be appreciated by those skilled in the art that the flexible apparatus continuously changes its forms in the process of switching from the flat state into the bent state or from the bent state into the flat state. In order to facilitate more convenient use by the users, the flexible apparatus can be arranged to be able to keep any form in the process of switching states.

FIG. 2 is a schematic diagram illustrating the internal structure of an embodiment of the flexible apparatus. The flexible apparatus includes a set of shafts 101, an elastic clamp member 103, a lining plate 106, an elastic sheet 107, a plurality of first connecting members 121, a plurality of second connecting members 122, a first connecting block 141, and a second connecting block 151. In this embodiment, a subset of two adjacent shafts 101 within the set of shafts are connected either by a plurality of first connecting members 121 or by a plurality of second connecting members 122. For two adjacent shafts 101 to be connected means that they are inserted into the openings of a single first connecting member 121 or a single second connecting member 122. In this embodiment, the two adjacent shafts 101 connected by a plurality of first connecting members 121 are not connected by a second connecting member 122, and vice versa (i.e., two adjacent shafts 101 connected by a plurality of second connecting members 122 are not connected by a first connecting member 121). The elastic clamp member 103 fits into the clamping grooves of a plurality of first connecting members 121 to stabilize the flexible apparatus in its flat state. When the flexible apparatus is in its flat state, the elastic clamp member 103 sits within the clamping grooves to help the flexible apparatus maintain its flat state.

Figure 3:
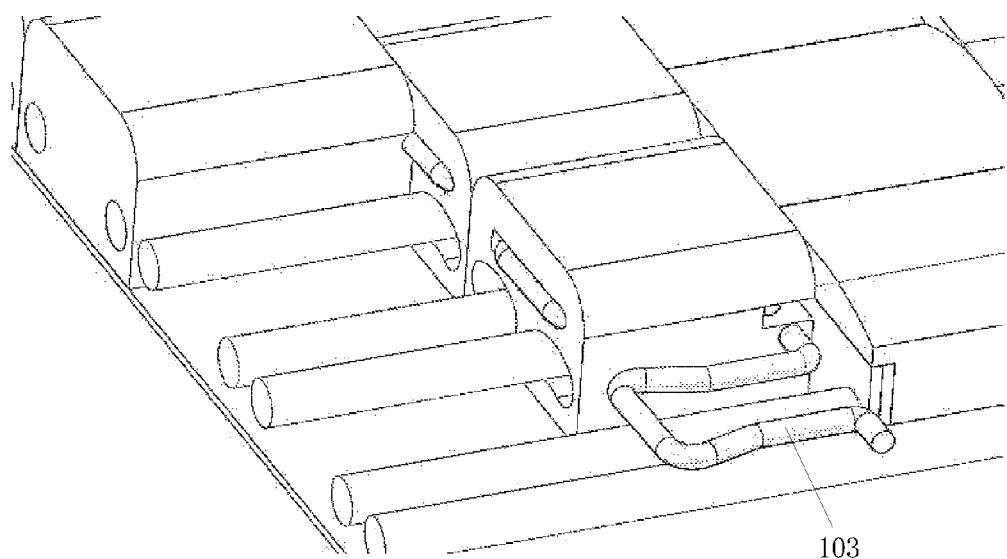
FIG. 3 is another internal schematic diagram of the flexible apparatus as shown in FIG. 1.

FIG. 3 is a schematic diagram illustrating an embodiment of the elastic clamp member 103. In this embodiment, the elastic clamp member 103 has a certain shape or geometry and runs serially through a row of second connecting members 122. In its static state, parts of the elastic clamp member 103 protrude from an opening or aperture on a side of a second connecting member 122. When the flexible apparatus is switched from the flat state into the bent state, the space between two adjacent second connecting members 122 in the same row widens. As a result, the shape or geometry of the elastic clamp member 103 running through the second connecting members in the row changes such that the elastic clamp member 103 no longer protrudes from each second connecting member 122, thus detaching from the clamping grooves of a row of first connecting members 121 adjacent to the row of second connecting members 122. Conversely, when the flexible apparatus is switched from the bent state into the flat state, the space between two adjacent second connecting members 122 in the same row decreases. As a result, the shape or geometry of the elastic clamp member 103 changes such that the elastic clamp member 103 protrudes from each second connecting member 122 and fits into the clamping grooves of the adjacent row of first connecting members 121.

To ensure any shape of the flexible apparatus can be realized in the process of switching among the flat state or bent state, the flexible apparatus also includes a damping member, wherein the damping member is arranged at the first connecting member 121 or the second connecting member 122, and the damping member is located between a row of first connecting members 121 and a row of second connecting members 122. The damping member in the present embodiment provides damping for relative movement of the first connecting member 121 and the second connecting member 122, so as to ensure that the flexible apparatus is capable of being kept in any shape.

FIG. 4 is a schematic diagram illustrating an embodiment of a damping member. In this embodiment, the damping member includes one or more elastic sheets 107. In one embodiment, the one or more elastic sheets 107 are positioned within a groove of a first connecting member 121 oriented toward one side of a second connecting member 122 The elastic sheet 107 has a pre-tightening force, used for applying a force away from the first connecting member 121 or the second connecting member 122 assembled with the elastic sheet 107 to the second connecting member 122 or the first connecting member 121. In another embodiment, the damping member can be a friction pad fixed on the inner perimeter of the openings of a second connecting member 122, the friction pad keeping the flexible apparatus in any shape by applying dampening force to a shaft 101 within the opening. The present embodiment has no specific restrictions on the type and position of the damping member.

FIG. 5 is a schematic diagram illustrating a side view of an embodiment of the flexible apparatus in a bent state. In this embodiment, the flexible apparatus includes a lining plate 106. The lining plate 106 is elastic and connects the flexible screen with the flexible apparatus. The ends of the lining plate 106 are fixedly connected with the first mounting block 104 and the second mounting block 105 (specifically can be arranged by welding or riveting, etc.). The lining plate 106 is located at the second side of the flexible apparatus, i.e., the lining plate 106 is located on the inner side of the flexible apparatus when the flexible apparatus is in the bent state and attached to the flexible screen between the flexible screen and the rows of first connecting members 121 and second connecting members 122 forming the flexible apparatus. The lining plate 106 allows for the flexible apparatus to lengthen and shorten as it bends and lays flat without subjecting the flexible screen to forces that would damage the screen.

To avoid separation of the lining plate 106 and the connecting members 121, 122 of the flexible apparatus during the state switching process, in one embodiment of the flexible apparatus, the lining plate 106 is connected with the midpoint (Point A to Point G as shown in FIG. 5) of the connecting members 121, 122 on the side oriented toward the second side of the flexible apparatus (specifically can be arranged by bonding).

The diagram of FIG. 5 also illustrates how the shafts 101 are positioned within the through openings of a second connecting member 122 when the flexible apparatus is in a bent state. The through openings of a second connecting member 122 may have different shapes that allow two adjacent shafts 101 to move within the opening to allow the flexible apparatus to bend. In one embodiment, the through openings of a second connecting member 122 are shaped in an arc. The position of a shaft 101 inserted within an opening of a second connecting member 122 moves from the inner end of the opening (i.e., towards the center of the second connecting member 122) towards the outer end of the opening (i.e., towards the periphery of the second connecting member 122) as the flexible apparatus is bent. Conversely, as the flexible apparatus flattens out, the position of a shaft 101 inserted within an opening of a second connecting member 122 moves in the opposite direction (i.e., from the outer end towards the inner end of the opening).

Put in another way, when the flexible apparatus is switched from the flat state into the bent state, two shafts 101 matching with a second connecting member 122 slide along the corresponding arc-shaped elongated holes and diverge from each other. The length increasing rate of the first side of the flexible apparatus is greater than that of the second side of the flexible apparatus; When the flexible apparatus is switched from the bent state into the flat state, two shafts 101 matching with a second connecting member 122 slide along their corresponding arc-shaped elongated holes and converge toward each other. The length decreasing rate of the first side of the flexible apparatus is greater than that of the second side of the flexible apparatus; The first side and the second side are two opposite sides in the flexible apparatus respectively, the second side being used to close to the flexible screen of the electronic device.

In the above scheme, the length change rate of the first side of the flexible apparatus is greater than that of the second side in the process of switching states, which can ensure that the second side of the flexible apparatus always corresponds to the same area on the flexible screen, thereby protecting the screen from damages in the process of randomly switching the forms of the flexible screen according to a user's needs.

In one specific embodiment, the two arc-shaped elongated holes (e.g., opening) on each second connecting member 122 curve in the same direction as the flexible apparatus.

In an embodiment, the bending directions (i.e., curvature) of all arc-shaped elongated holes on each second connecting member 122 are arranged to be oriented toward the second side of the flexible apparatus in the flexible apparatus to ensure that the bending directions thereon are the same when the flexible apparatus is in the bent state or is in the process of switching states, so as to avoid the meander of the flexible screen supported by the flexible apparatus and friction with the casing of the electronic device, thereby protecting the flexible screen from damage. At the same time, the bending directions of the arc-shaped elongated holes on the second connecting members 122 restrict the flexible apparatus to only be deformed as the arc-shaped forms the inner side of the second side in the flexible apparatus to avoid a reversed bending of the flexible apparatus, thereby avoiding damages to the flexible screen.

Figure 6:
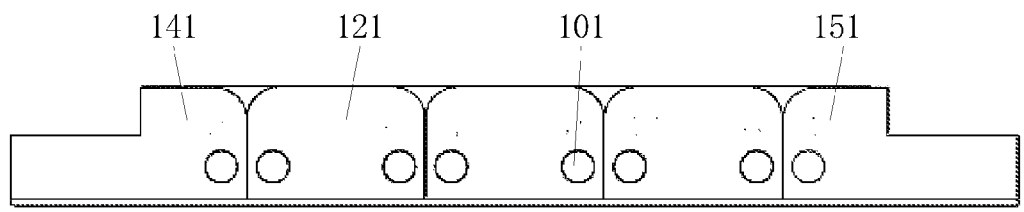
FIG. 6 is a schematic diagram illustrating a side view of the flexible apparatus in the flat state according to an embodiment.

FIG. 6 is a schematic diagram illustrating a side view of an embodiment of the flexible apparatus in a flat state. In this embodiment, the first connecting block 141 and the second connecting block 151 connect the rows of connecting members 121, 122.

Figure 7:
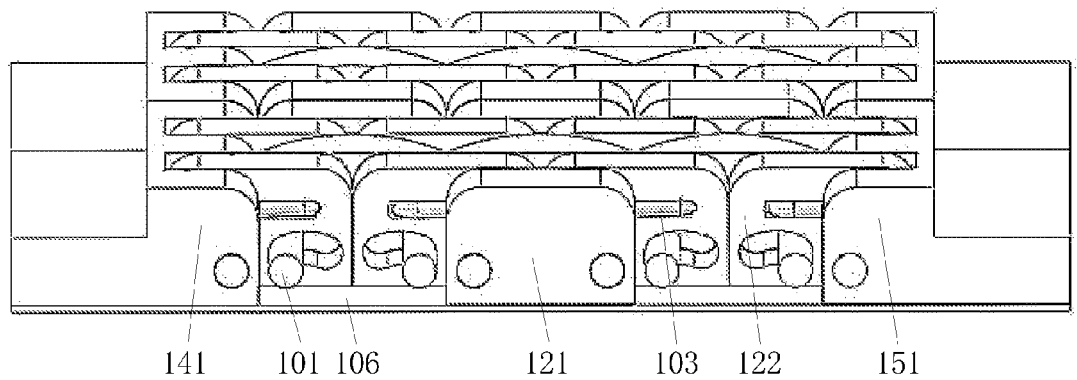
FIG. 7 is an internal schematic diagram of the flexible apparatus as shown in FIG. 6.

FIG. 7 is a schematic diagram illustrating another view of an embodiment of the flexible apparatus in a flat state. The diagram of FIG. 7 shows more clearly how multiple rows of connecting members 121, 122 are connected to the first connecting block 141 and the second connecting block 151 on each end of the flexible apparatus.

Figure 8:
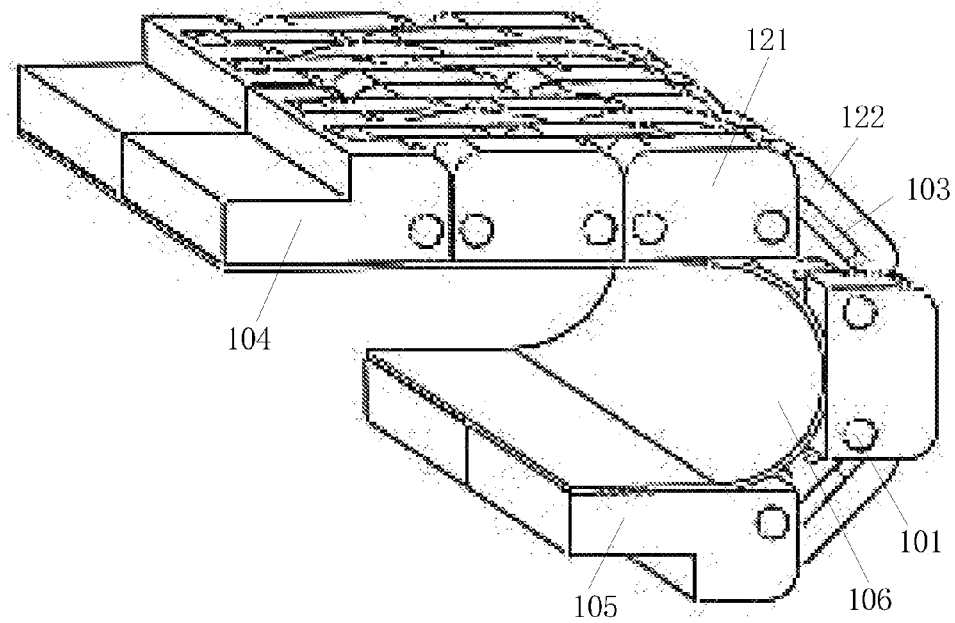
FIG. 8 is another schematic diagram of the flexible apparatus as shown in FIG. 6 in the bent state.

FIG. 8 is another diagram showing an embodiment of the flexible apparatus in a bent state. The flexible apparatus has a first mounting block 104 on one end and a second mounting block 105 on an opposite end. The first mounting block 104 has a first connecting block 141 and the second mounting block 105 has a second connecting block 151. The first connecting block 141 has an opening for insertion of a shaft 101 at one end of the set of elongated shafts. Similarly, the second connecting block 151 has an opening for insertion of a shaft 101 at the other end of the set of elongated shafts. In one embodiment, the first connecting block 141 and the second connecting block 151 are connected to a plurality of rows of second connecting members 122 by the shafts 101 on each end of the set of elongated shafts. In this embodiment, sliding of the shafts 101 along the opening of the second connecting members 122 aligned with the first connecting block 141 and the second connecting block 151 allow for a gap between the first mounting block 104 and/or the second mounting block 105 with their adjacent first connecting members 121 and second connecting members 122, thus increasing the length and flexibility of the flexible apparatus.

Figure 9:
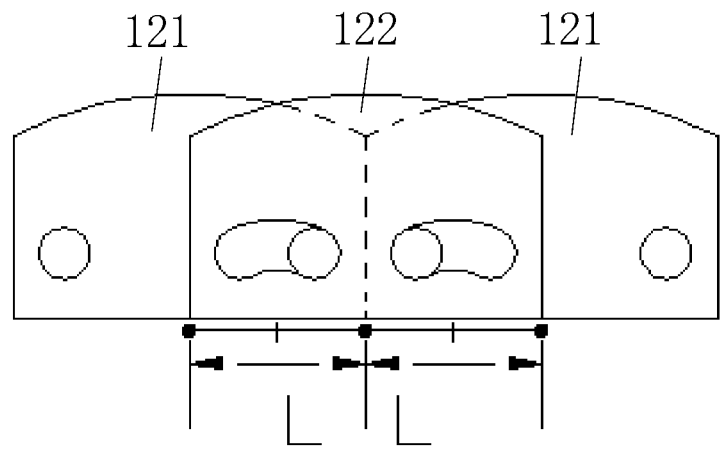
FIG. 9 is a schematic diagram illustrating the relative positions of certain members of a flexible apparatus is a flat state according to an embodiment.

FIG. 9 is a schematic diagram illustrating the relative positions of first connecting members 121 with a second connecting member 122 in an adjacent row while the flexible apparatus is in a flat state. As explained above, while the flexible apparatus is in a flat or bent state, the adjacent shafts 101 inserted within the openings of the second connecting member 122 are inserted into two adjacent first connecting members 121. Furthermore, while the flexible apparatus is in a flat state, the adjacent shafts 101 are positioned within the openings of the second connecting member 122 towards the center of the second connecting member 122. In this state, the "arc" formed by the adjacent first connecting members 121 is flat and the length of this arc is simply 2L, L being the length of the overlap between a first connecting member 121 and a second connecting member 122 in adjacent rows of connecting members.

Figure 10:
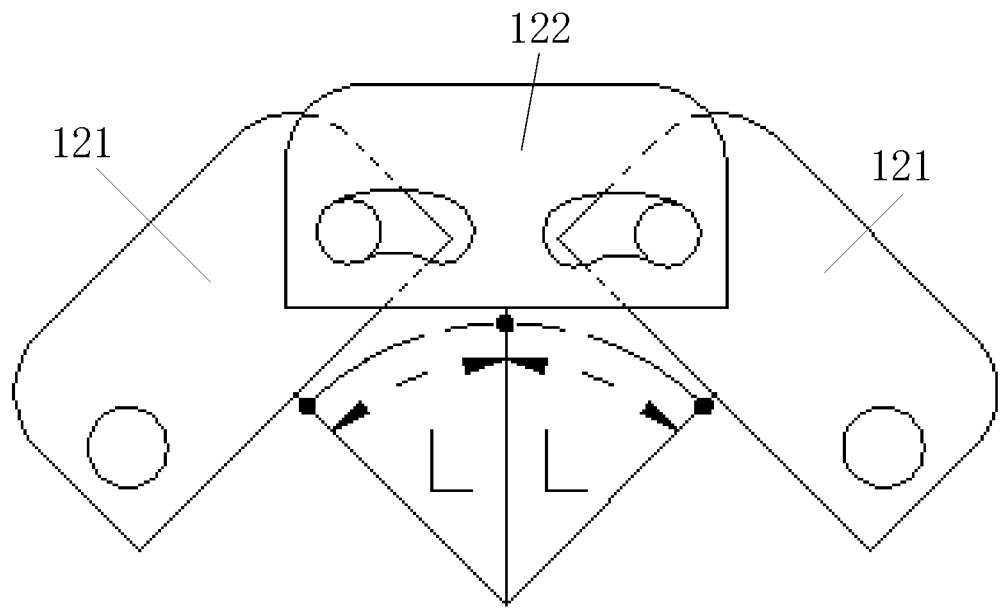
FIG. 10 is a schematic diagram illustrating the relative positions of certain members of a flexible apparatus in a bent state according to an embodiment.

FIG. 10 is a schematic diagram illustrating the relative positions of first connecting members 121 with a second connecting member 122 in an adjacent row while the flexible apparatus is in a bent state. As explained above, while the flexible apparatus is in a flat or bent state, the adjacent shafts 101 inserted within the openings of the second connecting member 122 are inserted into two adjacent first connecting members 121. Furthermore, while the flexible apparatus is in a bent state, the adjacent shafts 101 are positioned within the openings of the second connecting member 122 towards the perimeter of the second connecting member 122.

The subject matter of the present disclosure also includes an electronic device, comprising a flexible screen and a flexible apparatus used for supporting the flexible screen.

Specifically, in the electronic device, the flexible screen is located at the second side of the flexible apparatus, the second side being the inner side of the flexible apparatus in the bent state.

In the embodiment of the electronic device, when the flexible apparatus switches states (i.e., from a flat state to a bent state), the length of the tangent of the first side of the flexible apparatus increases gradually, the length of the tangent of the second side remains unchanged, and the second side remains attached to the same position on the flexible screen, so that the second side of the flexible apparatus does not slide relative to the flexible screen, so as to avoid pulling on the flexible screen directly or through the case of the electronic device, and to avoid damaging the flexible screen. The tangent at the second side of the flexible apparatus with the lining plate 106 refers to the margin line of the lining plate 106 attached to one side of the flexible screen; the tangent at the second side of the flexible apparatus without the lining plate 106 refers to the curve formed by midpoints of all connecting members oriented toward one end of the second side.

Furthermore, in the electronic device provided by the above embodiment, when the flexible apparatus switches states, all positions corresponding to the midpoints of all connecting members oriented toward one end of the second side of the flexible apparatus remain unchanged on the flexible screen, i.e., all positions corresponding to the midpoints oriented toward one end of the second side in the connecting member along the normal direction remain unchanged on the flexible screen. The normal direction refers to the normal direction of the curve formed by midpoints oriented toward one end of the second side in each connecting member.

The embodiment of the present invention provides an electronic device, which adopts the flexible apparatus to avoid damages to the flexible screen. Certainly, the electronic device provided by this embodiment also possesses other effects of the flexible apparatus provided by the above embodiments, however the details will not be repeated herein.

What is claimed is:

1. An apparatus to support a flexible screen of an electronic device, the apparatus comprising:
    a plurality of shafts aligned in parallel along an axis;
    a plurality of rows of first connecting members, each row of first connecting members comprising a plurality of first connecting members, wherein each first connecting member has a top side, a bottom side, a left aperture and a right aperture extending from the top side to the bottom side, with each aperture coupled to a shaft of the plurality of shafts along the axis;
    a plurality of rows of second connecting members, each row of second connecting members comprising a plurality of second connecting members, wherein each second connecting member has a top side, a bottom side, a left aperture and a right aperture extending from the top side to the bottom side, with each aperture coupled to a shaft of the plurality of shafts along the axis;
    wherein
        the width of the apertures of each second connecting member is greater than the width of the apertures of each first connecting member;

the plurality of shafts are connected by alternate rows of first connecting members and second connecting members along a length of the plurality of shafts; and each connecting member in a row of connecting members overlaps with two connecting members in an adjacent row of connecting members.

2. The apparatus of claim 1, wherein the left aperture and right aperture of each second connecting member have an arc shape with an inner end and an outer end and the shaft coupled to each aperture can move along the curve of the arc.

3. The apparatus of claim 2, further comprising:
an elastic clamp member that runs serially through a row of second connecting members;
wherein
each connecting member of the row of second connecting members further comprises a horizontal aperture on its bottom side;
each connecting member of a row of first connecting members adjacent to the row of second connecting members further comprises a horizontal groove on its top side.

4. The apparatus of claim 3, wherein when the apparatus is in a flat state, the elastic clamp member protrudes through the horizontal apertures of a plurality of connecting members of the row of second connecting members into the horizontal grooves of a plurality of connecting members of the adjacent row of first connecting members.

5. The apparatus of claim 4, the apparatus further comprising a damping member to help the flexible apparatus maintain a specific shape.

6. The apparatus of claim 5, wherein the damping member comprises an elastic sheet between the alternate rows of first connecting members and second connecting members.

7. The apparatus of claim 5, wherein the damping member comprises a friction pad fixed on the inner perimeter of the left and right apertures of a second connecting member.

8. The apparatus of claim 2, further comprising
a first mounting block comprising a first connecting block, the first mounting block attached to a first end of the alternate rows of first connecting members and second connecting members; and
a second mounting block comprising a second connecting block, the second mounting block attached to a second end of the alternate rows of first connecting members and second connecting members.

9. The apparatus of claim 8, wherein the first connecting block and the second connecting block comprise a plurality of apertures to be coupled with a shaft of the plurality of shafts.

10. The apparatus of claim 9, wherein the plurality of apertures of the first connecting block are aligned with the left aperture of a plurality of second connecting members and the plurality of apertures of the second connecting block are aligned with the right aperture of a plurality of second connecting members.

11. The apparatus of claim 8, further comprising a lining plate attached at its ends to the first mounting block and the second mounting block.

12. The apparatus of claim 11, wherein the lining plate is attached to a midpoint of each connecting member of the alternate rows of first connecting members and second connecting members.

13. The apparatus of claim 2, wherein the curvature of the left and right apertures of each second connecting member are oriented in the same direction to facilitate the bending of the apparatus in that direction.

14. An electronic device comprising:
a flexible screen; and
an apparatus supporting the flexible screen, the apparatus comprising:
a first side and a second side;
a plurality of shafts aligned in parallel along an axis;
a plurality of rows of first connecting members, each row of first connecting members comprising a plurality of first connecting members, wherein each first connecting member has a top side, a bottom side, a left aperture and a right aperture extending from the top side to the bottom side, with each aperture coupled to a shaft of the plurality of shafts along the axis;
a plurality of rows of second connecting members, each row of second connecting members comprising a plurality of second connecting members, wherein each second connecting member has a top side, a bottom side, a left aperture and a right aperture extending from the top side to the bottom side, with each aperture coupled to a shaft of the plurality of shafts along the axis;
wherein
the width of the apertures of each second connecting member is greater than the width of the apertures of each first connecting member;
the plurality of shafts are connected by alternate rows of first connecting members and second connecting members along a length of the plurality of shafts; and
each connecting member in a row of connecting members overlaps with two connecting members in an adjacent row of connecting members.

15. The electronic device of claim 14, wherein the left aperture and right aperture of each second connecting member have an arc shape with an inner end and an outer end and the shaft coupled to each aperture can move along the curve of the arc.

16. The electronic device of claim 15, further comprising
a first mounting block comprising a first connecting block, the first mounting block attached to a first end of the alternate rows of first connecting members and second connecting members; and
a second mounting block comprising a second connecting block, the second mounting block attached to a second end of the alternate rows of first connecting members and second connecting members.

17. The electronic device of claim 16, further comprising a lining plate attached at its ends to the first mounting block and the second mounting block.

18. The electronic device of claim 17, wherein the lining plate is attached to a midpoint of each connecting member of the alternate rows of first connecting members and second connecting members.

19. The electronic device of claim 14, wherein the flexible screen is located on the second side of the flexible apparatus, the second side being the inner side of the flexible apparatus in a bent state.

20. The electronic device of claim 18, wherein when the length of the flexible apparatus changes in response to a movement of one or more shafts coupled to a plurality of second connecting members, all positions corresponding to the midpoints of each connecting member of the alternate rows of first connecting members and second connecting members on the second side of the flexible apparatus remain unchanged on the flexible screen.

* * * * *